(12) United States Patent
Yoo et al.

(10) Patent No.: US 7,531,454 B2
(45) Date of Patent: May 12, 2009

(54) METHOD AND APPARATUS OF FABRICATING LIQUID CRYSTAL DISPLAY DEVICE

(75) Inventors: Soon Sung Yoo, Gunpo-si (KR); Oh Nam Kwon, Yongin-si (KR); Heung Lyul Cho, Suwon-si (KR); Seung Hee Nam, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 260 days.

(21) Appl. No.: 11/474,977

(22) Filed: Jun. 27, 2006

(65) Prior Publication Data
US 2007/0004108 A1      Jan. 4, 2007

(30) Foreign Application Priority Data
Jun. 30, 2005      (KR)      ...... 10-2005-0058723

(51) Int. Cl.
*H01L 21/44*      (2006.01)

(52) U.S. Cl. .......... 438/670; 438/30; 438/151; 438/479; 438/586; 438/669; 438/671; 438/951

(58) Field of Classification Search .......... 438/30, 438/151, 479, 586, 669–671, 951
See application file for complete search history.

(56) References Cited

U.S. PATENT DOCUMENTS

| 5,541,128 | A * | 7/1996 | Kwasnick et al. ........... 438/160 |
| 5,565,376 | A * | 10/1996 | Lur et al. ................... 438/427 |
| 7,145,213 | B1 * | 12/2006 | Ebel et al. .................. 257/414 |
| 2005/0024439 | A1 * | 2/2005 | Fukunaga et al. ............. 347/55 |
| 2005/0048400 | A1 * | 3/2005 | Okino et al. ............. 430/270.1 |
| 2005/0087742 | A1 * | 4/2005 | Chang et al. ................. 257/72 |
| 2005/0130353 | A1 * | 6/2005 | Yoo et al. ................... 438/151 |
| 2007/0141721 | A1 * | 6/2007 | Vafai et al. ................. 436/518 |

* cited by examiner

*Primary Examiner*—Kevin M Picardat
*Assistant Examiner*—Bac H Au
(74) *Attorney, Agent, or Firm*—McKenna Long & Aldridge LLP

(57) ABSTRACT

A method and an apparatus of fabricating a liquid crystal display device adapted to improve a lift-off efficiency are disclosed. The liquid crystal display device is also disclosed. The method includes forming a first thin film on a substrate; forming a photo-resist pattern on the first thin film; etching the first thin film using the photo-resist pattern as a mask; forming a second thin film on the substrate having the photo-resist pattern; forming a plurality of stripper infiltration paths; and removing the photo-resist pattern and the second thin film using a stripper within the stripper infiltration paths. The device includes two substrates facing each other; a liquid crystal layer; data lines and gate lines that cross each other to define pixel regions; thin film transistors; pixel electrodes connected to the thin film transistors; and an inorganic layer in each pixel region, wherein the inorganic layer includes a plurality of cracks.

6 Claims, 10 Drawing Sheets

METHOD AND APPARATUS OF FABRICATING LIQUID CRYSTAL DISPLAY DEVICE

This application claims the benefit of Korean Patent Application No. 10-2005-0058723, filed in Korea on Jun. 30, 2005, which is hereby incorporated by reference for all purposes as if fully set forth herein.

BACKGROUND OF THE INVENTION

1. Field of the Invention

This invention relates to a liquid crystal display device and a method and an apparatus of fabricating the liquid crystal display device. More particularly, this invention relates to a liquid crystal display device having an improved lift-off efficiency and a method and an apparatus of fabricating the liquid crystal display device that are adapted to improve lift-off efficiency.

2. Description of the Related Art

Generally, a liquid crystal display device (LCD) controls the light transmittance of a liquid crystal having a dielectric anisotropy by using an electric field to thereby display a picture. An LCD includes a liquid crystal display panel for displaying a picture using a liquid crystal cell matrix and a driving circuit for driving the liquid crystal display panel.

Referring to FIG. 1, a related art liquid crystal display panel includes a color filter substrate 10 and a thin film transistor substrate 20 joined together with a liquid crystal 24 therebetween.

The color filter substrate 10 may include a black matrix 4, a color filter 6 and a common electrode 8 that are sequentially provided on an upper glass substrate 2. The black matrix 4 may be provided in a matrix on the upper glass substrate 2. The black matrix 4 divides an area of the upper glass substrate 2 into a plurality of cell areas that are to be provided with the color filter 6. The black matrix 4 prevents light interference between adjacent cells and external light reflection. The color filter 6 is provided at the cell area divided by the black matrix 4 in such a manner to be divided into red (R), green (G) and blue (B) filters, thereby transmitting red light, green light and blue light. The common electrode 8 may be formed from a transparent conductive layer entirely coated onto the color filter 6, and supplies a common voltage Vcom that serves as a reference voltage upon driving the liquid crystal 24. In order to make a surface of the color filter level with that of the black matrix 4, an over-coat layer (not shown) may be provided on the color filter 6 and the black matrix 4.

The thin film transistor substrate 20 includes a thin film transistor 18 and a pixel electrode 22 provided for each cell area. The cell area is defined by a crossing between a gate line 14 and a data line 16 on a lower glass substrate 12. The thin film transistor 18 applies a data signal from the data line 16 to the pixel electrode 22 in response to a gate signal from the gate line 14. The pixel electrode 22 may be formed of a transparent conductive layer and is supplied a data signal from the thin film transistor 18 to drive the liquid crystal 24.

The liquid crystal 24 having a dielectric anisotropy is rotated according to an electric field generated by the data signal to control light transmittance. Thus, a gray scale level is implemented.

Further, the liquid crystal display panel may include an alignment film (not shown) for pre-tilting an initial aligning, and a spacer (not shown) for constantly keeping a cell gap between the color filter substrate 10 and the thin film transistor substrate 20.

In such a liquid crystal display panel, the color filter substrate 10 and the thin film transistor substrate 20 are formed by a plurality of mask processes. Herein, one mask process includes many processes such as thin film deposition (or coating), cleaning, photolithography, etching, stripping and inspection processes, etc.

Particularly, because fabricating the thin film transistor substrate includes a semiconductor process and requires a plurality of mask processes, it has a complicated fabricating process. This complicated fabricating process acts as a major factor in the increased manufacturing cost of the liquid crystal display panel. Therefore, the fabricating process of the thin film transistor substrate has progressed towards a reduction in the number of required mask processes.

For example, a method of fabricating a related art thin film transistor substrate may be modified to simplify the entire process by including a diffractive exposure mask in the fourth mask process. Moreover, in a recently developed process, the method of fabricating the thin film transistor substrate may be modified to reduce the entire process by including a lift-off process in the third mask process. Specifically, in the method of fabricating the thin film transistor substrate using the third mask process, a transparent conductive layer is initially entirely coated onto a photo-resist pattern for forming a contact hole. Then, a photo-resist pattern and the transparent conductive layer are removed by a lift-off process, thereby patterning the transparent conductive layer. For improving a lift-off efficiency, a stripper infiltration path may be implemented to enable a stripper to easily infiltrate into a transparent conductive layer coated on a photo-resist pattern.

SUMMARY OF THE INVENTION

Accordingly, the present invention is directed to a liquid crystal display device and a method and an apparatus of fabricating the liquid crystal display device that substantially obviate one or more of the problems due to limitations and disadvantages of the related art.

An advantage of the present invention is to provide a liquid crystal display device having an improved lift-off efficiency.

Another advantage of the present invention is to provide a method and an apparatus of fabricating a liquid crystal display device that are adapted to improve a lift-off efficiency.

Additional features and advantages of the invention will be set forth in the description which follows, and in part will be apparent from the description, or may be learned by practice of the invention. The objectives and other advantages of the invention will be realized and attained by the method and apparatus particularly pointed out in the written description and claims hereof as well as the appended drawings.

To achieve these and other advantages and in accordance with the purpose of the present invention, as embodied and broadly described, a method of fabricating a liquid crystal display device includes forming a first thin film on a substrate; forming a photo-resist pattern on the first thin film; etching the first thin film using the photo-resist pattern as a mask; forming a second thin film on the substrate having the photo-resist pattern; forming a plurality of stripper infiltration paths in the second thin film; and removing the photo-resist pattern and the second thin film using a stripper within the stripper infiltration paths.

In another aspect of the present invention, an apparatus of fabricating a liquid crystal display device includes a first deposition unit to form a first thin film on a substrate; a photolithography unit to form a photo-resist pattern on the first thin film; an etching unit to etch the first thin film using the photo-resist pattern as a mask; a second deposition unit to form a second thin film on the substrate having the photo-resist pattern; a heat treatment unit to form a plurality of stripper infiltration paths; and a removing unit to remove the photo-resist pattern and the second thin film using a stripper within at least one of the stripper infiltration paths.

In another aspect of the present invention, a liquid crystal display device includes a first substrate and a second substrate facing each other; a liquid crystal layer interposed between the first substrate and the second substrate; data lines and gate lines on the first substrate that cross each other to define pixel regions; thin film transistors at crossings of each of the data lines and each of the gate lines; pixel electrodes connected to each of the thin film transistors; and an inorganic layer in each pixel region, wherein the inorganic layer includes a plurality of cracks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
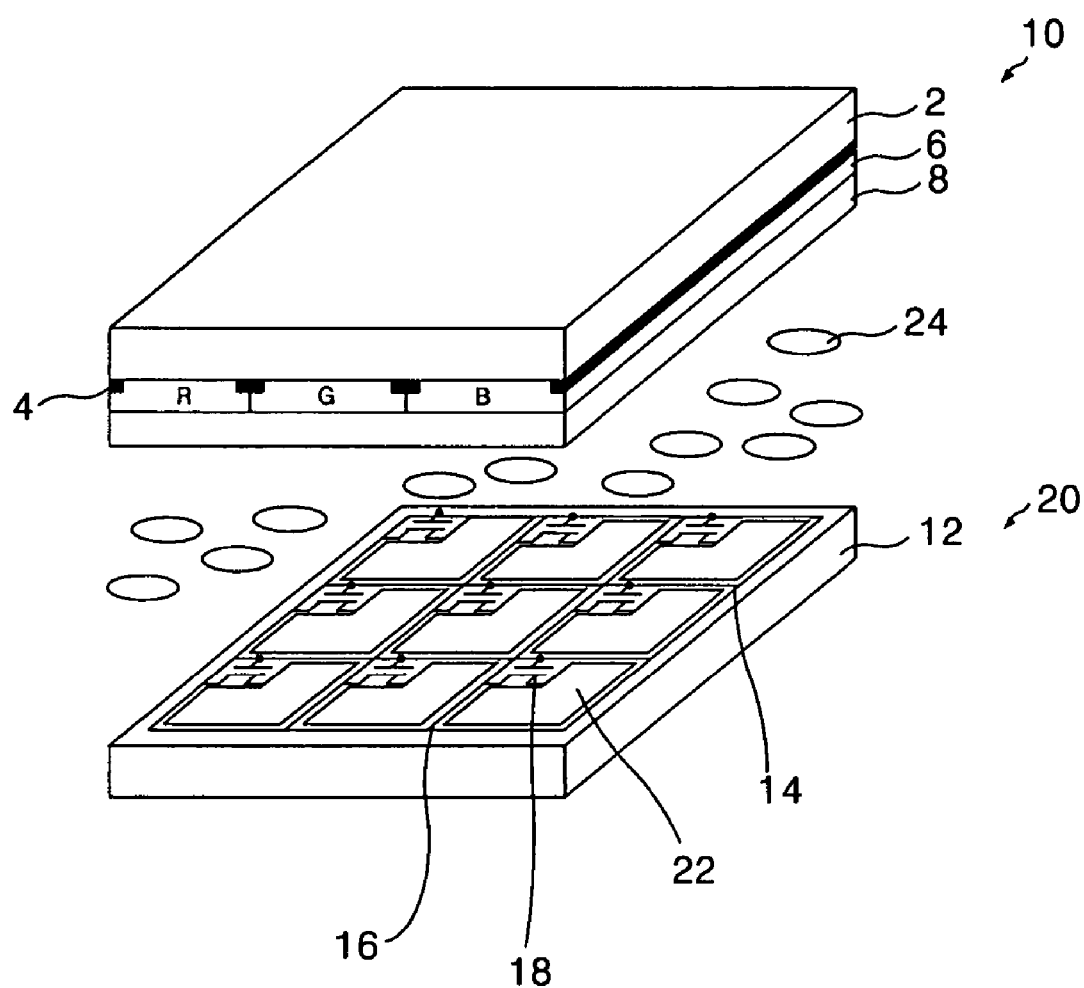
FIG. 1 is a schematic perspective view showing a structure of a related art liquid crystal display panel.
Figure 2:
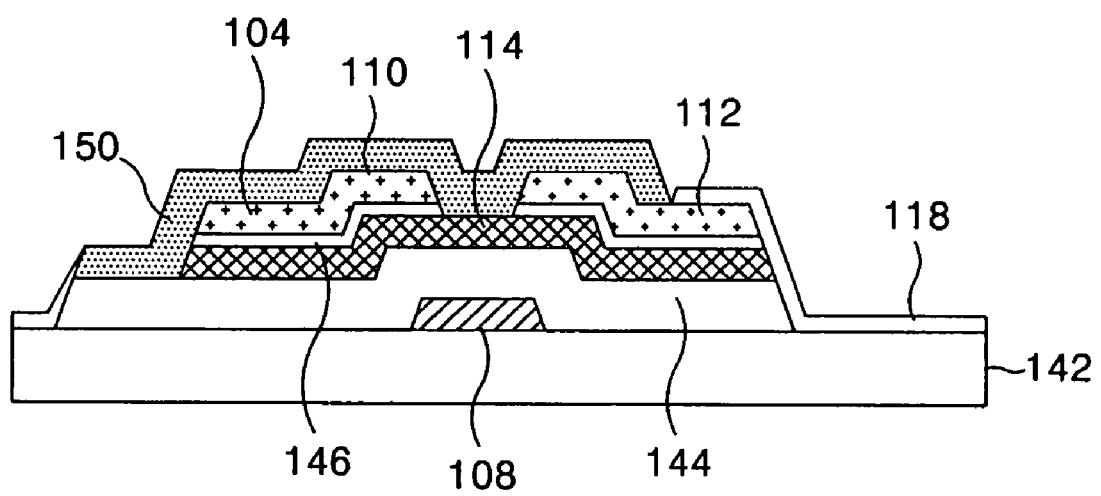
FIG. 2 is a sectional view showing a portion of a thin film transistor substrate using a lift-off process according to an exemplary embodiment of the present invention.

Referring to FIG. 2, a thin film transistor substrate includes a pixel electrode 118 formed on a substrate 142 and connected to a thin film transistor.

The thin film transistor enables a video signal applied to the data line to be charged into a pixel electrode 118 and be stored in response to a scanning signal applied to the gate line. The thin film transistor may include a gate electrode 108 connected to the gate line, a source electrode 110 connected to the data line 104, a drain electrode 112 positioned in opposition to the source electrode 110 to be connected to the pixel electrode 118, an active layer 114 overlapping with the gate electrode 108, and an ohmic contact layer 146 between the source electrode 110, the drain electrode 112 and the active layer 114. A gate insulating film 144 may be formed between the gate electrode 108 and the active layer 114 to define a channel between the source electrode 110 and the drain electrode 112.

The pixel electrode 118 may be provided at a pixel area in which a protective or passivation film 150 and the gate insulating film 144 are removed, and may be connected to the drain electrode 112 exposed at the pixel area.

A method of fabricating such thin film transistor substrate will be described.

A gate line and the gate electrode 108 connected the gate line may be formed on a substrate 142 by a first mask process. The gate insulating film 144, the active layer 114 and the ohmic contact layer 146, a data line 104, the source electrode 110 connected the data line 104, and the drain electrode 112 may be formed by a second mask process. Then, the protective or passivation film 150 and the pixel electrode 118 may be formed by a third mask process.

FIG. 3A to FIG. 3D are sectional views for describing the third mask process for forming the protective or passivation film 150 and the pixel electrode 118 in FIG. 2.

Figure 3A:
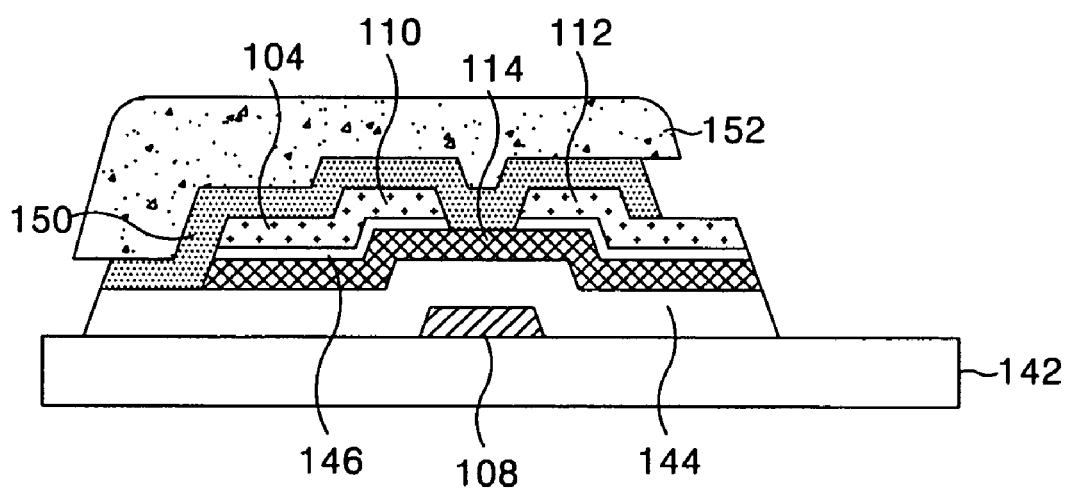
FIG. 3A to FIG. 3D are sectional views showing a lift-off process in a method of fabricating a thin film transistor substrate in FIG. 2.

Referring to FIG. 3A, the protective or passivation film 150 may be formed on the gate insulating film 144 provided with the source electrode 110 and the drain electrode 112. A photo-resist pattern 152 may be formed on the protective or passivation film 150. A photoresist may be patterned by a photo-lithography process. The photoresist is exposed, developed and patterned to form the photo-resist pattern 152. Then, the protective or passivation film 150 and the gate insulating film 144 are selectively etched using the photo-resist pattern 152 as a mask. The etchant may be a wet etchant, for example, a strong acid, such as sulfuric acid, phosphoric acid, hydrochloric acid, nitric acid, acetic acid, or any combination thereof. The wet etchant is more selective to the protective or passivation film 150 and the gate insulating film 144 over the photo-resist pattern 152. This may cause the protective or passivation film 150 and the gate insulating film 144 to be over-etched, so that the photo-resist pattern 152 has an overhang structure. Thus, the substrate 142 of a pixel area is thereby exposed.

Figure 3B:
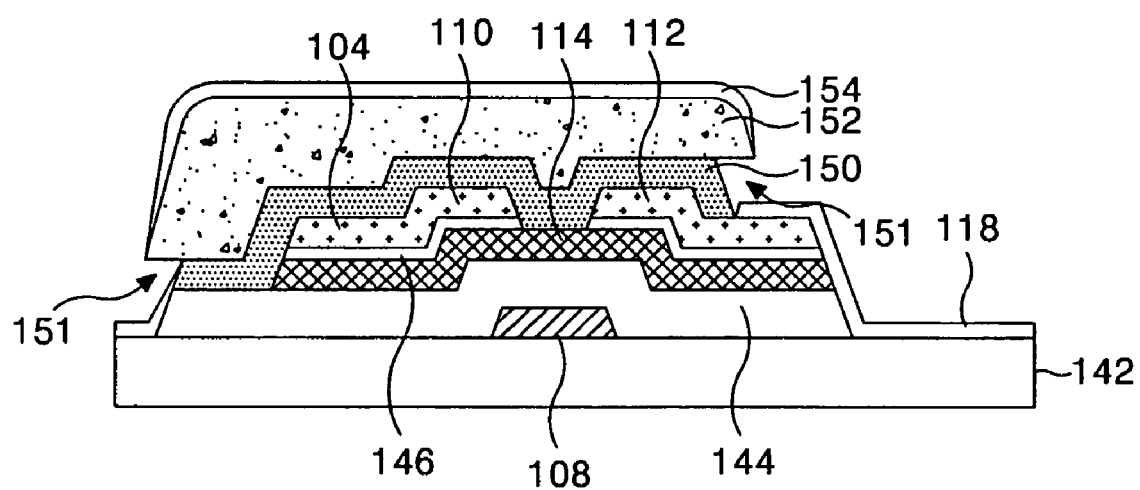

Referring to FIG. 3B, a transparent conductive layer may be substantially entirely formed on the substrate 142 with the photo-resist pattern 152, thereby providing the pixel electrode 118 at the pixel area and providing the transparent conductive layer as a secondary layer 154.

Figure 3C:
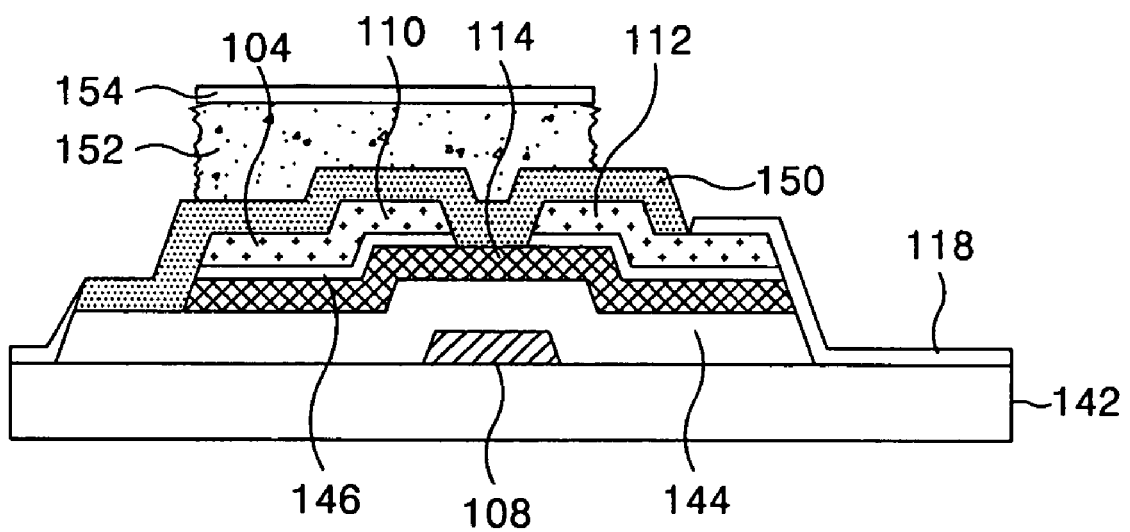
Figure 3D:
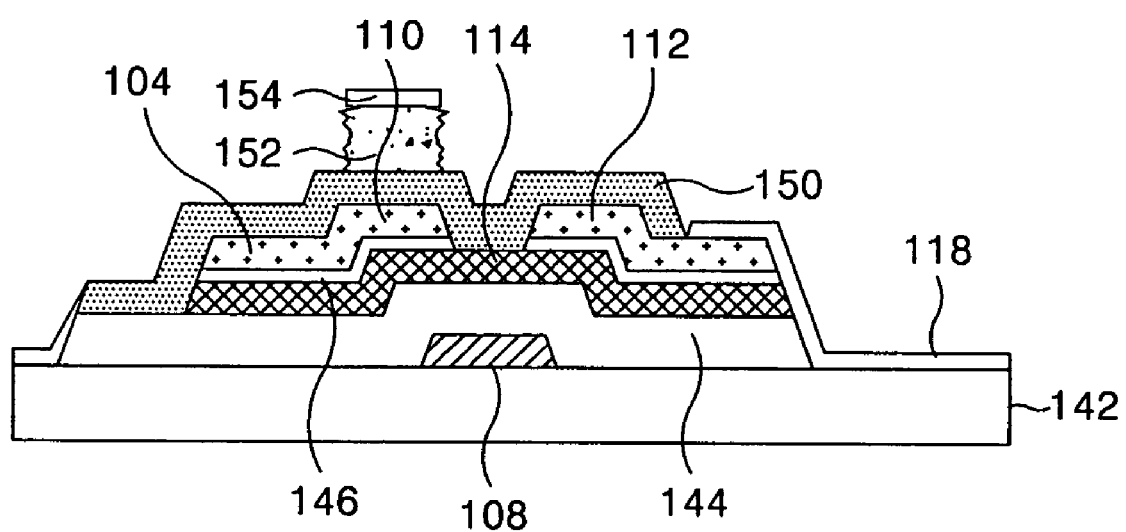

Next, the secondary layer 154 and the photo-resist pattern 152 may be removed by a lift-off process. A resist stripper is applied to the structure. The stripper does not infiltrate the secondary layer 154. The stripper accesses the photo-resist pattern 152 through an opened path 151 formed by the overhang structure between the photo-resist pattern 152 and the pixel electrode 118. As a result, the photo-resist pattern 152 is removed in a horizontal direction by the stripper penetrating into undersides of the photo-resist pattern, so the photo-resist pattern is removed along with the secondary layer 154 as shown in FIG. 3C and FIG. 3D.

Because the opened path 151 in which the resist stripper accesses the resist is at least a few microns to hundreds of microns wide, the opened path 151 causes the processing time of the lift-off process to be increased.

To improve the process of fabricating a liquid crystal display according to the present invention, an artificial crack may be formed in the secondary layer 154. The photo-resist pattern 152 and the secondary layer 154 have different thermal expansion coefficients. This causes the artificial crack to be formed in the secondary layer. Accordingly, the stripper infiltrates into the secondary layer through at least one artificial crack and the photo-resist pattern, thereby allowing the lift-off processing time to be reduced.

Exemplary embodiments of the present invention will be described with reference to FIG. 4A to FIG. 5.

Figure 4A:
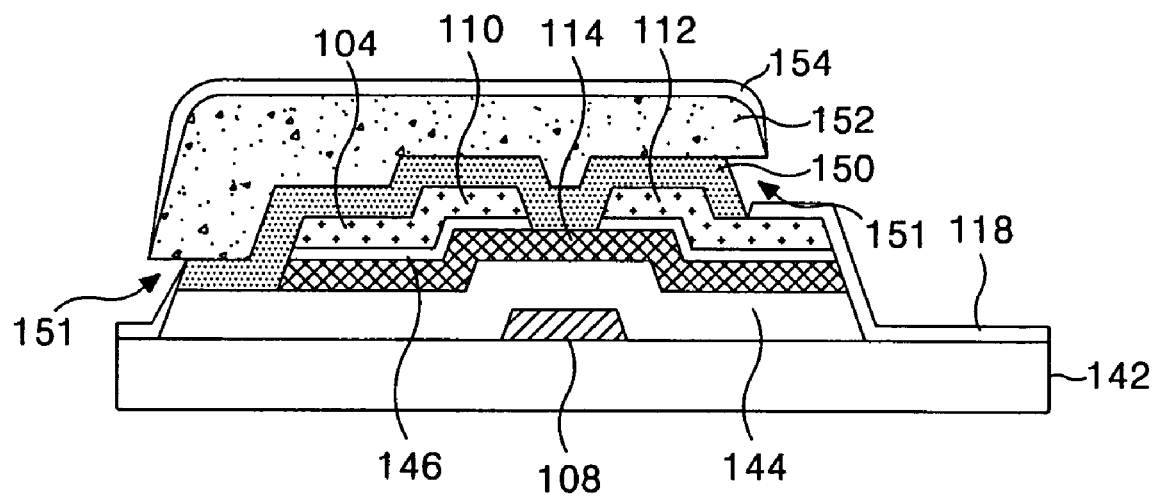
FIG. 4A to FIG. 4C are sectional views showing a third mask process of a thin film transistor substrate according to an exemplary embodiment of the present invention.
Figure 4B:
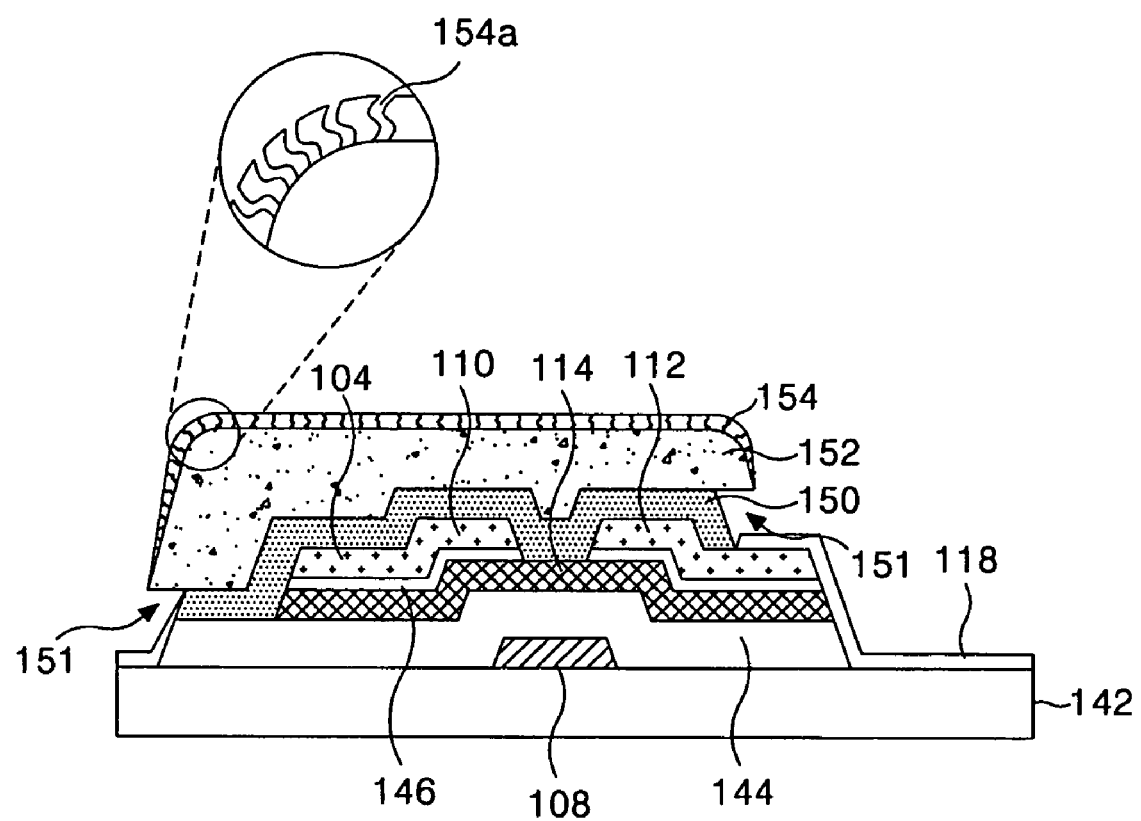
Figure 4C:
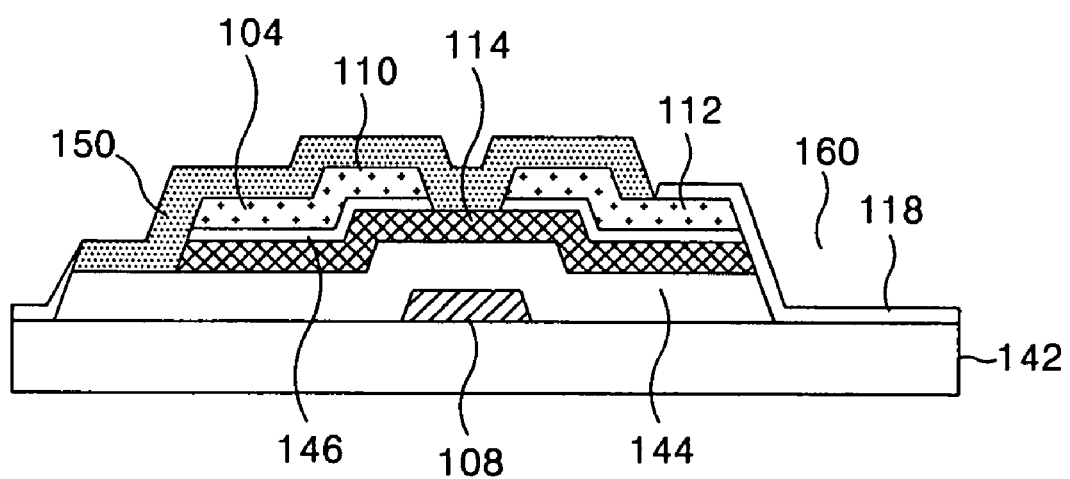

FIG. 4A to FIG. 4C are sectional views showing a third mask process of a thin film transistor substrate according to an exemplary embodiment of the present invention.

Figure 5:
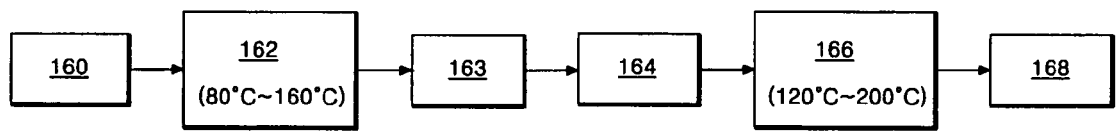
FIG. 5 is a block diagram showing third mask process units of a thin film transistor substrate according to an exemplary embodiment of the present invention.

FIG. 5 shows a third mask processing device of the present invention in which a protective film deposition unit 160, a photolithography unit 162, an etching unit 163, a transparent conductive layer deposition unit 164, a heat treatment unit 166 and a lift-off unit 168 are arranged.

Referring to FIG. 4A, the protective or passivation film 150 may be formed on a substrate 142 provided with a thin film transistor by the protective film deposition unit 160 shown in FIG. 5. The thin film transistor may include the gate electrode 108 connected to the gate line, the source electrode 110 connected to the data line 104, the drain electrode 112 positioned in opposition to the source electrode 110 to be connected to the pixel electrode 118, the active layer 114 overlapping with the gate electrode 108, and an ohmic contact layer 146 provided between the source electrode 110, the drain electrode 112 and the active layer 114. A gate insulating film 144 may be formed between the gate electrode 108 and the active layer 114 to define a channel between the source electrode 110 and the drain electrode 112.

Then, the photo-resist pattern 152 may be formed on the protective or passivation film 150 by using the photolithography unit 162. The protective or passivation film 150 and the gate insulating film 144 may be etched by the etching unit 163, thereby exposing the substrate 142 at the pixel area having no photo-resist pattern 152. The gate insulating film 144 may be over-etched, so that the photo-resist pattern 152 and the gate insulating film 144 have an overhang structure, as described above.

The transparent conductive layer may be substantially entirely formed on the substrate 142 left with the photo-resist pattern 152 by the transparent conductive layer deposition unit 164. Accordingly, the pixel electrode 118 is formed at the pixel area of the substrate 142 and the secondary layer 154 is formed on the photo-resist pattern 152.

Referring to FIG. 4B, a plurality of stripper infiltration paths 154a, which may be a plurality of cracks, are formed on the secondary layer 154. The stripper infiltration paths 154a are formed based on a difference of thermal expansion coefficients between the photo-resist pattern 152 and the secondary layer 154. The stripper infiltration paths 154a are formed by a heat treatment process in the heat treatment unit 166. A difference of thermal expansion coefficients may exist when the secondary layer 154 includes an inorganic layer. The inorganic layer may include such materials as insulating materials, semiconductive materials, transparent conductive materials, metals or metal alloys. The thermal expansion coefficient of inorganic materials is in most cases larger than the thermal expansion coefficient of organic materials. Thus, the thermal expansion coefficient of an inorganic layer, such as a transparent conductive layer, is larger than the thermal expansion coefficient of the photo-resist pattern 152, which is an organic layer. In a photolithography process, a temperature of baking the photo-resist pattern 152 is substantially relatively low in order to provide a stripper infiltration path 154a, which may be a crack, on the secondary layer 154 by the heat treatment process. For example, a photo-resist pattern baking temperature of the photolithography unit is approximately 130° C. while the photo-resist pattern 152 is baked at approximately 80° C.-120° C. in the photolithography unit 162 of the present invention. The heat treatment unit 166 allows a thin film transistor substrate provided with the secondary layer 154 on the photo-resist pattern 152 to be treated by a temperature more than a baking temperature of the photo-resist pattern 152, for example a temperature of approximately 120° C.-200° C. Accordingly, at least one stripper infiltration path 154a, which may be a crack, is generated on the secondary layer 154 having a higher thermal expansion coefficient than the photo-resist pattern 152. The heat treatment unit 166 may employ a heat treatment process, such as infrared (IR) heating or using an oven, for inducing a thermal expansion difference between the photo-resist pattern 152 and the secondary layer 154. The heat treatment unit 166 may also employ light energy.

In exemplary embodiments of the present invention, at least one stripper infiltration path may be formed by using a plasma process, a sputtering process, or an ion beam process. In a plasma process, charged particles may bombard the secondary layer 154 causing a via in the secondary layer 154. In a sputtering process, particles may bombard the secondary layer 154 causing a via in the secondary layer 154. In an ion beam process, a focused ion beam may be employed to strike the secondary layer 154 to cause a reaction at the surface of the secondary layer 154 and form stripper infiltration paths 154a.

Referring to FIG. 4C, the photo-resist pattern 152 and the secondary layer 154 are removed by a lift-off process in the lift-off unit 168. The resist stripper accesses the photo-resist pattern 152 by an opened path 151 in which the secondary layer 154 and the pixel electrode 118 are opened by the overhang structure of the photo-resist pattern 152, as well as a stripper infiltration path 154a formed in the secondary layer 154. This allows the photo-resist pattern 152 and the secondary layer 154 to be rapidly removed. Accordingly, the lift-off processing time may be reduced and the lift-off processing capability can be improved.

The liquid crystal display device formed by using the apparatus and method includes a first substrate and a second substrate facing each other, a liquid crystal layer interposed between the first substrate and the second substrate, data lines and gate lines on the first substrate that cross each other to define pixel regions, thin film transistors at crossings of each of the data lines and each of the gate lines, pixel electrodes connected to each of the thin film transistors, and an inorganic layer in each pixel region, wherein the inorganic layer includes a plurality of cracks.

In the apparatus and method of fabricating the liquid crystal display device, a plurality of stripper infiltration paths is formed on the secondary layer by a heat treatment process using a thermal expansion difference between the photo-resist pattern and the secondary layer, thereby allowing a lift-off processing time to be reduced and a lift-off processing capability to be improved. Accordingly, the apparatus and method of fabricating the liquid crystal display device allow productivity to be improved.

If the gate insulating film and the organic passivation film are formed between the pixel electrode ITO and the glass substrate, and then the heat treatment for generating the crack is practiced to the resultant structure, a plurality of cracks may be generated in the pixel electrode ITO of the liquid crystal display device due to the difference of the heat-expansion level generated between the ITO and the organic material.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:

forming a first thin film on a substrate;

forming a photo-resist pattern on the first thin film;

etching the first thin film using the photo-resist pattern as a mask;

forming a second thin film on the substrate having the photo-resist pattern;

forming a plurality of stripper infiltration paths in the second thin film; and removing the photo-resist pattern and the second thin film using a stripper within the stripper infiltration paths, wherein forming a plurality of stripper infiltration paths in the second thin film includes performing a heat treatment process, wherein forming the plurality of stripper infiltration paths further includes baking the photo-resist pattern and wherein a temperature of baking is set under a temperature of the heat treatment process, wherein the temperature of baking is approximately 80° C.-120° C., wherein the temperature of the heat treatment process is approximately 120° C.-200° C., wherein the second thin film is a transparent conductive layer.

2. The method of claim 1, wherein the photo-resist pattern is formed of an organic material.

3. The method of claim 1, wherein the first thin film is an insulating film.

4. The method of claim 1, wherein the heat treatment process includes at least one of a heating method and a light energy irradiating method.

5. The method of claim 4, wherein the heating method includes an infrared heating method.

6. The method of claim 1, wherein removing the photo-resist pattern and the second thin film uses a lift-off process.

* * * * *